(12) United States Patent
Makhratchev et al.

(10) Patent No.: US 10,026,636 B2
(45) Date of Patent: Jul. 17, 2018

(54) ELECTROSTATIC CHUCK HAVING REDUCED POWER LOSS

(71) Applicant: Applied Materials, Inc., Santa Clara, CA (US)

(72) Inventors: Konstantin Makhratchev, Fremont, CA (US); Jennifer Y. Sun, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 204 days.

(21) Appl. No.: 15/043,179

(22) Filed: Feb. 12, 2016

(65) Prior Publication Data

US 2016/0163577 A1 Jun. 9, 2016

Related U.S. Application Data

(62) Division of application No. 13/766,208, filed on Feb. 13, 2013, now Pat. No. 9,281,226.

(60) Provisional application No. 61/638,871, filed on Apr. 26, 2012.

(51) Int. Cl.
| | |
|---|---|
| *H01L 21/683* | (2006.01) |
| *H01L 21/67* | (2006.01) |
| *B23K 10/00* | (2006.01) |
| *H01R 43/16* | (2006.01) |

(52) U.S. Cl.
CPC .......... *H01L 21/6833* (2013.01); *B23K 10/00* (2013.01); *H01L 21/67103* (2013.01); *H01R 43/16* (2013.01); *Y10T 29/49204* (2015.01)

(58) Field of Classification Search
None
See application file for complete search history.

(56) References Cited

U.S. PATENT DOCUMENTS

| | | | | |
|---|---|---|---|---|
| 6,310,755 B1 * | 10/2001 | Kholodenko | ......... | C04B 35/185 361/115 |
| 6,483,690 B1 * | 11/2002 | Nakajima | ........... | H01L 21/6833 361/234 |
| 6,538,872 B1 * | 3/2003 | Wang | .................. | H01L 21/6833 361/103 |

(Continued)

FOREIGN PATENT DOCUMENTS

KR 2009-0007476 A 1/2009

OTHER PUBLICATIONS

PCT Notification of Transmittal of the International Search Report and the Written Opinion of the International Searching Authority for International Application No. PCT/US2013/033001 dated Jul. 18, 2013; 11 total pages.

*Primary Examiner* — Mary Lynn F Theisen
(74) *Attorney, Agent, or Firm* — Patterson + Sheridan LLP

(57) ABSTRACT

Embodiments of the invention generally relate to an electrostatic chuck having reduced power loss, and methods and apparatus for reducing power loss in an electrostatic chuck, as well as methods for testing and manufacture thereof. In one embodiment, an electrostatic chuck is provided. The electrostatic chuck includes a conductive base, and a ceramic body disposed on the conductive base, the ceramic body comprising an electrode and one or more heating elements embedded therein, wherein the ceramic body comprises a dissipation factor of about 0.11 to about 0.16 and a capacitance of about 750 picoFarads to about 950 picoFarads between the electrode and the one or more heating elements.

15 Claims, 3 Drawing Sheets

(56) References Cited

U.S. PATENT DOCUMENTS

| | | | |
|---|---|---|---|
| 2005/0042881 A1* | 2/2005 | Nishimoto | H01L 21/67248 438/710 |
| 2005/0128674 A1* | 6/2005 | Ohashi | H01L 21/6831 361/233 |
| 2006/0268491 A1 | 11/2006 | Itakura et al. | |
| 2007/0199660 A1 | 8/2007 | Yokoyama | |
| 2007/0258186 A1* | 11/2007 | Matyushkin | H01L 21/67109 361/234 |
| 2007/0286985 A1* | 12/2007 | Suzuki | H05B 3/03 428/119 |
| 2008/0017104 A1* | 1/2008 | Matyushkin | H01L 21/67109 118/696 |
| 2008/0174930 A1* | 7/2008 | Hattori | B29C 43/006 361/234 |
| 2009/0277895 A1 | 11/2009 | Komatsu et al. | |
| 2010/0046134 A1 | 2/2010 | Mizuno et al. | |
| 2011/0063771 A1* | 3/2011 | Nishioka | C04B 35/053 361/234 |
| 2011/0297082 A1* | 12/2011 | Watanabe | C23C 4/02 118/663 |
| 2012/0028057 A1 | 2/2012 | Aihara et al. | |

* cited by examiner

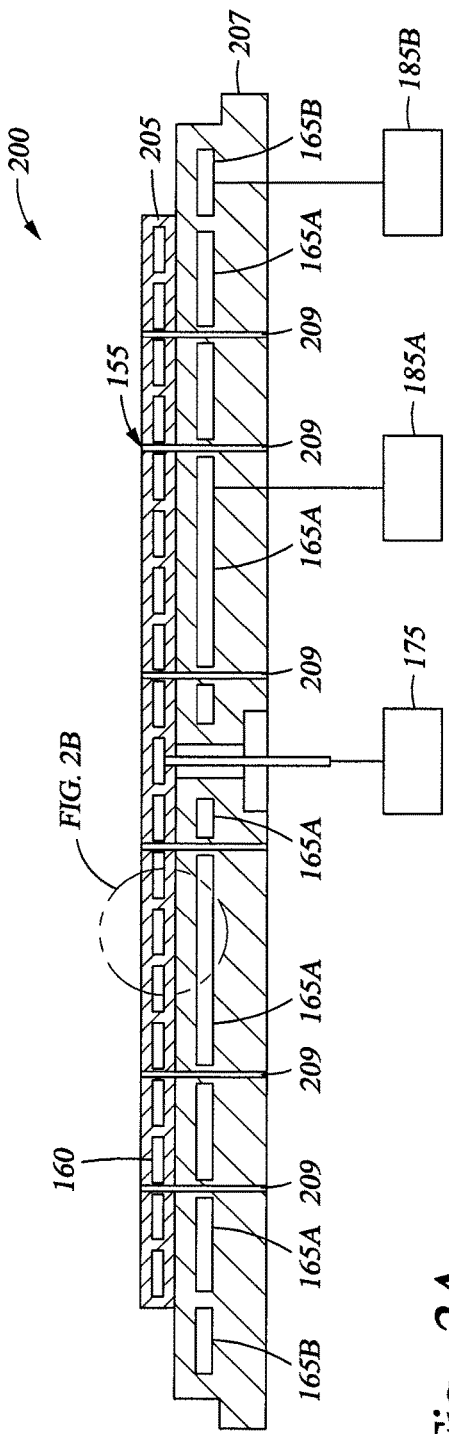
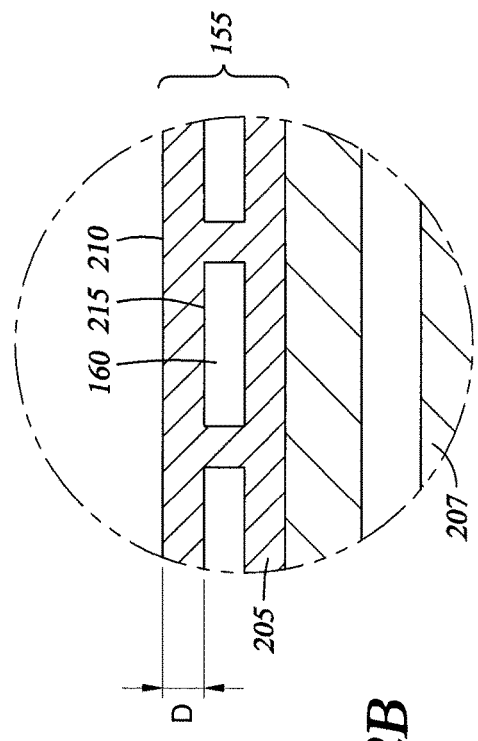
Fig. 2A
Fig. 2B

ELECTROSTATIC CHUCK HAVING REDUCED POWER LOSS

CROSS-REFERENCE TO RELATED APPLICATIONS

This application is a divisional of U.S. patent application Ser. No. 13/766,208, filed Feb. 13, 2013, which claims benefit of U.S. Provisional Patent Application Ser. No. 61/638,871, filed Apr. 26, 2012, which application is hereby incorporated by reference herein.

BACKGROUND

Field

Embodiments of the invention generally relate to an electrostatic chuck having reduced power loss, and methods and apparatus for reducing power loss in an electrostatic chuck, as well as methods for testing and manufacture thereof.

Description of the Related Art

In the manufacture of electronic devices on substrates, such as semiconductors and displays, many vacuum processes are utilized, such as chemical vapor deposition (CVD), physical vapor deposition (PVD), etch, implant, oxidation, nitridation, or other processes, to form the electronic devices. The substrates are typically processed one by one on an electrostatic chuck in a substrate processing chamber. To increase throughput, modern manufacturers often utilize a plurality of these substrate processing chambers operating in parallel (i.e., running a common process recipe). Each of the processing chambers may be the same make and model and are typically configured to process a substrate according to the common recipe. Thus, plural substrates may be processed within the same time period to produce identical product.

While the processing chambers may be substantially identical, subtle variations may exist between the processing chambers. The variations may require adjustment of the process parameters on one or more of the processing chambers to obtain "chamber match" or "chamber matching." One methodology to reduce chamber on-wafer results in processing chambers utilizing radio frequency (RF) induced plasma processes modifies the RF power parameters of a particular processing chamber to compensate for a chamber-to-chamber variation in order produce a product that is in tolerance with other products that are processed in other processing chambers according to the common recipe. However, to modify the RF power parameters to obtain chamber matching, additional hardware is typically required. The additional hardware is often costly and typically does not address the root cause of the chamber-to-chamber variation.

Accordingly, it is desirable to reduce the chamber-to-chamber variations in on-wafer results in order to streamline parallel processing of substrates.

SUMMARY

Embodiments of the invention generally relate to an electrostatic chuck having reduced power loss, and methods and apparatus for reducing power loss in an electrostatic chuck, as well as methods for testing and manufacture thereof. In one embodiment, an electrostatic chuck is provided. The electrostatic chuck includes a conductive base, and a ceramic body disposed on the conductive base, the ceramic body comprising an electrode embedded therein, wherein the ceramic body comprises a dissipation factor of about 0.11 to about 0.16.

In another embodiment, a plasma reactor is provided. The plasma reactor includes a vacuum chamber, an electrostatic chuck (ESC) within the chamber for supporting a substrate to be processed, and a radio frequency (RF) supply voltage source coupled to an electrode disposed within the ESC. The ESC comprises a ceramic body coupled to a conductive base, the ceramic body comprises a ceramic material having the electrode embedded therein, and the ceramic material includes a dissipation factor of about 0.11 to about 0.16.

In another embodiment, a method for manufacturing a puck for an electrostatic chuck is provided. The method includes placing a ceramic powder in a mold, forming an electrode and one or more heating elements in the ceramic powder, and sintering and/or pressing the ceramic powder to produce a ceramic body having a crystal structure with one or both of a dissipation factor of about 0.11 to about 0.16 and a capacitance of about 750 picoFarads to about 950 picoFarads between the electrode and the one or more heating elements.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a side cross-sectional view of an electrostatic chuck according to embodiments described herein.

FIG. 2B is an enlarged cross-sectional view of a portion of the electrostatic chuck of FIG. 2A.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to an electrostatic chuck for use in a vacuum processing chamber. The electrostatic chuck has reduced power loss, and methods and apparatus for reducing power loss in an electrostatic chuck, as well as methods for testing and manufacture thereof, are also provided. The methods and apparatus as described herein reduce chamber to chamber variations and enable chamber matching for operating plural processing chambers in parallel.

Figure 1:
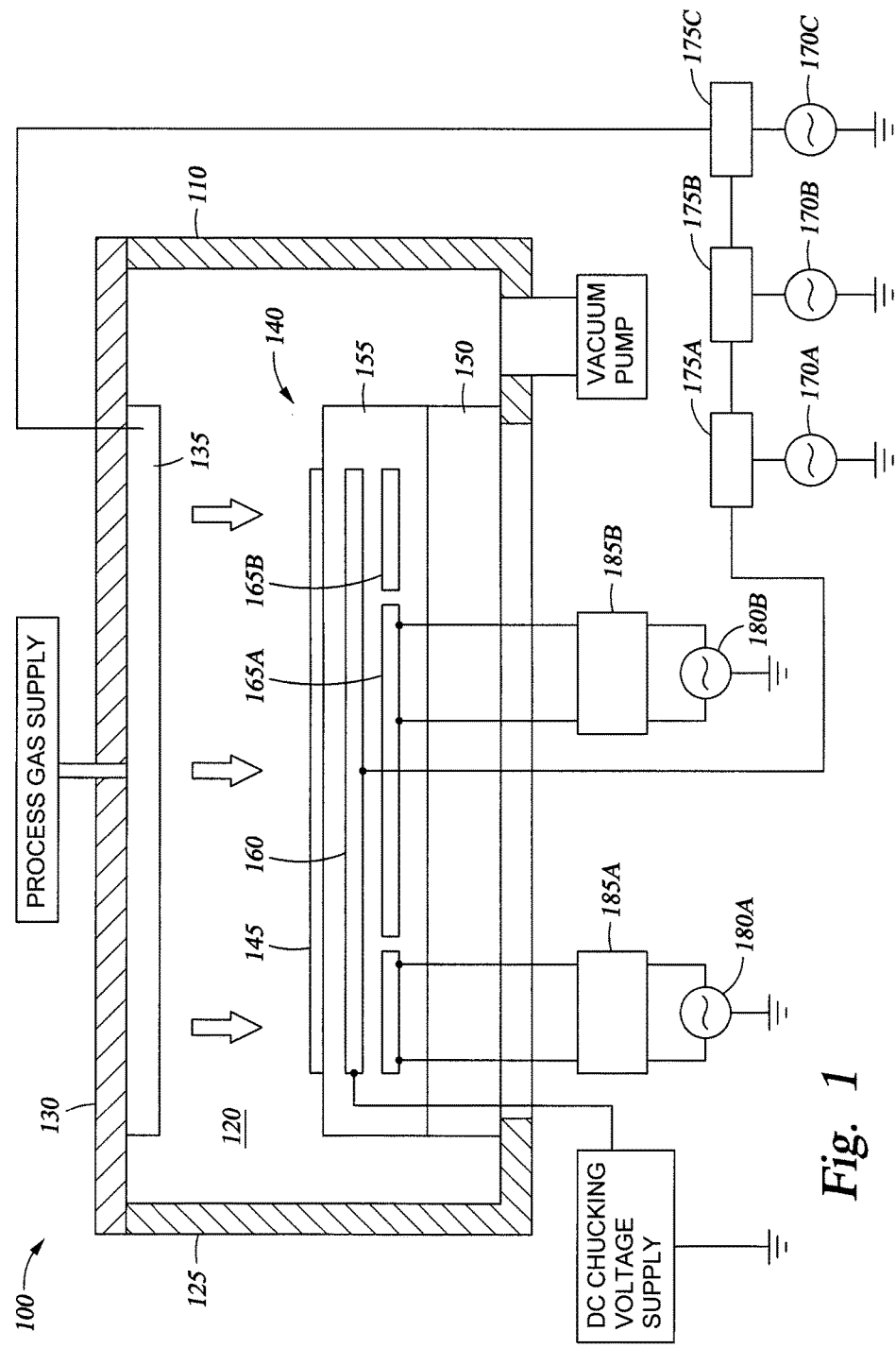
FIG. 1 is a schematic cross-sectional view of one embodiment of a plasma reactor.

FIG. 1 is a schematic cross-sectional view of one embodiment of a plasma reactor 100. The plasma reactor 100 comprises a vacuum chamber 110 enclosing a processing volume 120. The processing volume 120 is defined by a cylindrical side wall 125 supporting a ceiling 130 that includes a process gas distribution showerhead 135. A process gas supply is coupled to the gas distribution showerhead 135. An electrostatic chuck (ESC) 140 holds a substrate 145 in the vacuum chamber 110. The ESC 140 includes a conductive base 150 and a puck 155 that may be formed of a dielectric material, such as a ceramic material. The puck 155 comprises a chucking electrode 160 and, in one embodiment, inner and outer heating elements 165A, 165B. The chucking electrode 160 may comprise a conductive mesh of a metal or metal alloy that is embedded within the puck 155. The inner and outer heating elements 165A, 165B may comprise a resistive heating element comprising a metal or metal alloy that is embedded within the puck 155 beneath the chucking electrode 160. A vacuum pump is coupled to the vacuum chamber 110 to generate a sub-atmospheric pressure within the vacuum chamber 110.

Two or more radio frequency (RF) bias power supplies are coupled to the process gas distribution showerhead 135 and one of the conductive base 150 or the chucking electrode 160. A first RF power supply, such as an RF source generator 170A may be coupled to the process gas distribution showerhead 135 and one of the conductive base 150 or the chucking electrode 160 through an impedance match circuit 175A to ignite a plasma and provide a source of reactive species in the processing volume 120. A second RF power supply, such as a first bias RF generator 170B coupled to an impedance match circuit 175B may be used to control the critical thin layer of plasma just above the substrate 145 within the processing volume 120. An optional third RF power supply; such as a second bias RF generator 170C coupled to an impedance match circuit 175C may be used in conjunction with the one or both of the RF source generator 170A and the first bias RF generator 170B to modulate the plasma within the processing volume 120. The RF source generator 170A may provide RF power of about 13.56 megaHertz (MHz) while the first bias RF generator 170B and/or the second bias RF generator 170C may provide bias RF power of about 2 MHz, 27 MHz and/or 60 MHz. The plasma reactor 100 also includes alternating current (AC) sources 180A, 180B to provide AC current to the inner and outer heating elements 165A, 165B through a low-pass filter 185A and a low-pass filter 185B, respectively.

The chucking electrode 160 is a conductor, such as a metal or metal alloy. The chucking electrode 160 can be composed of various conductors, such as non-magnetic materials, for example aluminum, copper, iron, molybdenum, titanium, tungsten, or alloys thereof. One version of the chucking electrode 160 comprises a mesh of molybdenum. The chucking electrode 160 may be configured as a mono-polar or bi-polar electrode. Mono-polar electrodes comprise a single conductor and have a single electrical connection to an external electrical power source, such as a direct current (DC) chucking voltage supply. Mono-polar electrodes cooperate with the charged species of a plasma formed in the processing volume 120 to apply an electrical bias across the substrate 145 to secure the substrate 145 on the ESC 140. Bi-polar electrodes have two or more conductors, each of which is biased relative to the other to generate an electrostatic force to secure the substrate 145 on the ESC 140. The chucking electrode 160 can be shaped as a wire mesh or a perforated metal plate. For example, a chucking electrode 160 comprising a mono-polar electrode can be a single continuous wire mesh embedded in the puck 155 as shown. An embodiment of a chucking electrode 160 comprising a bi-polar electrode can be two or more conductive members that may be independently biased by the DC chucking voltage supply.

In operation, direct current from the DC chucking voltage supply is applied to the chucking electrode 160. The DC chucking voltage supply is utilized to monitor induced DC bias potential on the substrate 145, calculate the necessary voltage for reliable electrostatic clamping, and is used to apply the proper clamping voltage to the chucking electrode 160. RF power from the RF source generator 170A is utilized to induce a plasma of process gas in the processing volume 120 above the substrate 145. The plasma may be modified by one or both of the first bias RF generator 170B and the second bias RF generator 170C. The combination of the plasma overlying the substrate 145 and the voltage applied to the chucking electrode 160 induces an electrostatic charge between the substrate 145 and the puck 155, which attracts the substrate 145 to the puck 155 surface. The substrate 145 may be processed on the ESC 140 at temperatures up to 600 degrees Celsius.

The RF power from the RF source generator 170A is used to produce plasma in the processing volume 120, which processes the substrate 145. Once the plasma is ignited, the amount of power from the RF source generator 170A has generally a minor effect on process performance. On the other hand, the first bias RF generator 170B provides a bias to the substrate 145 on the puck 155 surface, which may additionally be used to control the parameters of the thin plasma layer just above the substrate 145 surface. As stated above, the process parameters are weakly dependent on the amount of source RF power, but strongly dependent on the bias RF power delivered to the plasma from the ESC 140.

However, it has been determined that some of the RF power is lost to ground. For example, some of the RF power is lost to ground by inductive capacitance with the heating elements 165A, 165B. In another example, some of the RF power is lost to ground through the DC chucking voltage supply. While the source power loss does not significantly affect the plasma, other parameters and subsystems of the plasma reactor 100 are greatly affected by variations in bias RF power. For example, DC voltage measured or calculated by the DC chucking voltage supply may be unstable due to changes in the thin plasma layer above the substrate 145 surface. For a single plasma reactor 100 operating separately from other chambers, the power loss may be consistent substrate-to-substrate and may go unnoticed. However, if the plasma reactor 100 is utilized in parallel with other similar chambers running the same recipe, the power losses of each chamber will likely vary, and adjustment and/or corrective action may be required in order to match each chamber.

The inventors have devised test methods for testing of the ESC 140 to determine physical properties of the ESC 140. The test methods as described herein yielded critical dimensions and values that mitigate capacitance to ground in the ESC 140. Thus, components of the ESC 140 may be subjected to the test methods to determine critical physical property values and dimensions prior to final assembly of the ESC 140.

FIG. 2A is a side cross-sectional view of an ESC 200 according to embodiments described herein. FIG. 2B is an enlarged cross-sectional view of a portion of the ESC 200 of FIG. 2A. The ESC 200 may be utilized as the ESC 140 in the plasma reactor 100 of FIG. 1. Common reference numerals are utilized and the description of some elements may not be repeated for brevity.

The ESC 200 comprises the puck 155 which comprises a ceramic body 205. The chucking electrode 160 may be formed in the ceramic body 205 by methods known in the art. In this embodiment, the ceramic body 205 is coupled to a ceramic base 207. The ESC 200 also includes a plurality of gas conduits 209 for providing a backside gas to a substrate (shown in FIG. 1). The heating elements 165A, 165B may be formed in the ceramic base 207 as shown in FIG. 2A, or in the puck 155 as shown in FIG. 1. The heating elements 165A, 165B may be formed in the ceramic base 207 by methods known in the art. Such methods include spray coating a conductor onto the underside of the puck 155 or the upper surface ceramic base 207, providing a preformed thin film electrode to the underside of the puck 155 or the upper surface ceramic base 207, among other methods. The ceramic body 205 and the ceramic base 207 may be fabricated from a ceramic material comprising at least one of aluminum oxide, aluminum nitride, silicon oxide, silicon carbide, silicon nitride, titanium oxide, zirconium oxide, and mixtures thereof. The ceramic body 205 may also comprise a samarium aluminum oxide material, such as $SmAl_xO_y$. The ceramic body 205 can be unitary monolith of ceramic made by hot pressing and sintering a ceramic powder, and then machining the sintered body to form the final shape of the puck 155. An upper surface of the ceramic body 205 defines a substrate receiving surface 210 that is the top surface of the puck 155 and which serves to hold a substrate 145, as shown in FIG. 1. The ceramic base 207 can be unitary monolith of ceramic made by hot pressing and sintering a ceramic powder, and then machining the sintered body to form the final shape of the ceramic base 207. The ceramic body 205 may be coupled to the ceramic base 207 by a binder or an adhesive as is known in the art.

According to embodiments described herein, the ceramic body 205 is processed (i.e., sintered, pressed) to produce a crystal structure having electrical characteristics that reduce RF losses to ground. The ceramic body 205 as described herein was tested at temperatures of about room temperature to about 250 degrees Celsius (° C.) and the electrical characteristics were as follows. In one embodiment, the ceramic body 205 comprises a dissipation factor (tangent δ) of about 0.10 to about 0.20 at temperatures up to about 250° C., more specifically a dissipation factor of about 0.11 to about 0.16 at temperatures of about room temperature to about 250° C. Additionally, the ceramic body 205 comprises a capacitance to heating elements 165A, 165B of about 750 picoFarads (pF) to about 950 pF between the chucking electrode 160 and the heating elements 165A, 165B at temperatures of about room temperature to about 250° C. The puck 155, having one or more of the capacitance and the dissipation factor described above, provides optimum RF power for plasma generation while minimizing RF losses to ground.

Referring to FIG. 2B, the ceramic body 205 of the puck 155 includes a top dielectric thickness, referred to as thickness D, indicating the thickness of dielectric material between the substrate receiving surface 210 and an upper surface 215 of the chucking electrode 160. In one embodiment, the thickness D is about 0.041 inches to about 0.044 inches. The puck 155 having the thickness D within these parameters provides sufficient DC voltage to wafer capacitance while minimizing capacitance to ground.

The puck 155 may be manufactured according to sintering temperatures and/or pressure parameters that are known to those of skill in the art. The thickness D may be produced by a suitable mold and/or pressure profiles during the sintering process. Machining the substrate receiving surface 210 of the ceramic body 205 may be optionally performed to produce the thickness D.

Figure 3:
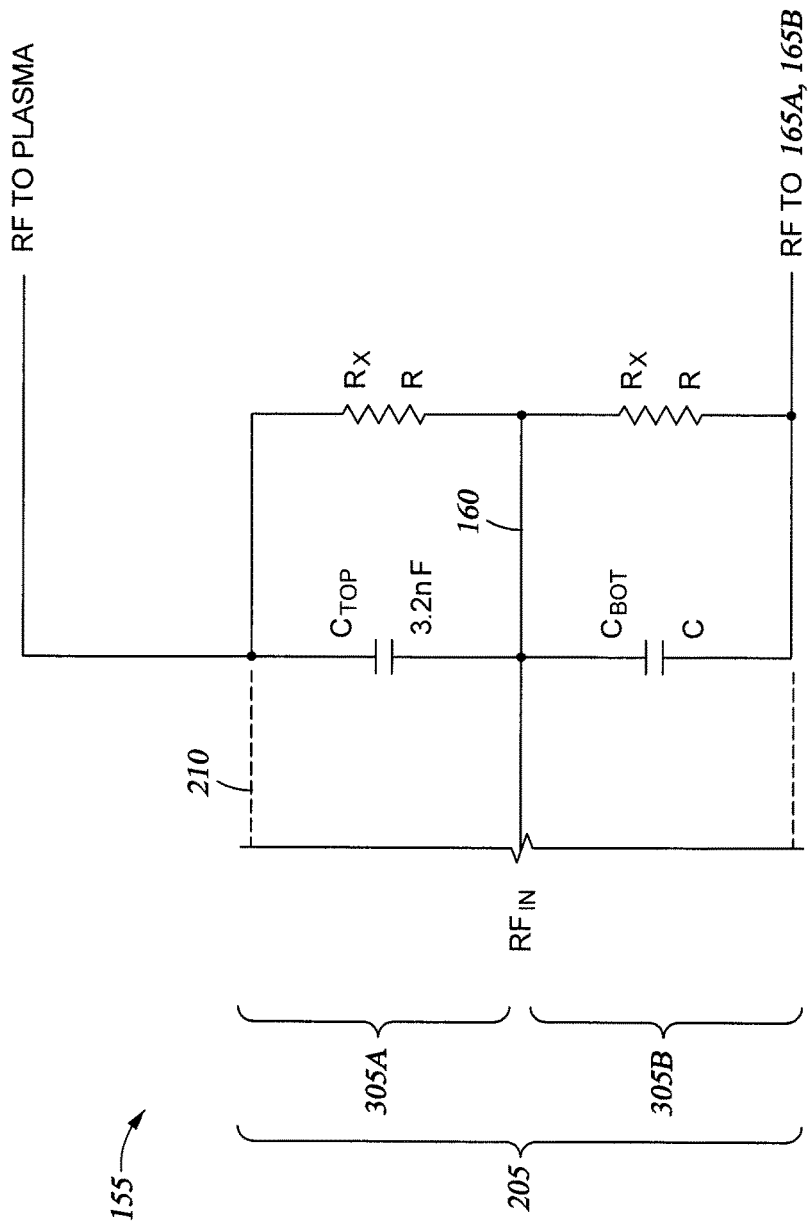
FIG. 3 is a schematic diagram of a puck showing RF power to the chucking electrode, the RF power to plasma and the RF power to heating elements.

FIG. 3 is a schematic diagram of a puck 155 showing RF power to the chucking electrode 160, the RF power to plasma and the RF power to heating elements 165A, 165B. In this Figure, the ceramic body 205 is split into a top portion 305A above the chucking electrode 160 and a lower portion 305B below the chucking electrode 160. The following table compares various values between a conventional ESC and the ESC 140 as described herein.

| | Total RF loss, % | Ctop, nF | Cbot, nF | tan(δ) |
|---|---|---|---|---|
| Conventional ESC | 37.5% | 3.2 | 1.2 | 0.6 |
| ESC 140 | 16.7% | 3.2 | 0.8 | 0.2 |
| Reduction | >about 50% | | about 33% | about 66% |

Additionally, the ESC 140 included a top loss (RF loss to chucking electrode 160 from 305A) of 0.133333, as compared to the top loss in the conventional ESC of 0.272727 (e.g., about 50% reduction). The bottom loss (RF loss to heating elements 165A, 165B from 305B) of the ESC 140 was 0.033333 as compared to 0.102273 in a conventional ESC (e.g., about 66% reduction).

As is demonstrated, the ESC 140 as described herein provides superior electrical characteristics as compared to a conventional ESC. The puck 155 of the ESC 140 may be manufactured according to sintering temperatures and/or pressure parameters that are known to those of skill in the art, and tested prior to shipment according to the following procedures.

Impedance testing of the puck 155 may be performed by clamping a substrate to the ESC 140 with vacuum through the gas conduits 209 (shown in FIG. 2A). The RF terminal to the chucking electrode 160 is connected to the positive (red) terminal of a capacitance meter and the negative terminal (black) of the capacitance meter is coupled to the conductive base 150 (shown in FIG. 1). The test will measure capacitance from the RF conductor to the substrate. The capacitance to heating elements 165A, 165B and tangent δ may be tested with a LCZ meter while the puck 155 is in a temperature stabilized enclosure. Dielectric thickness (thickness D (FIG. 2B)) may be determined by various techniques, such as ultrasonic imaging or eddy current measurements.

The embodiments above provide a manufacturing protocol and design parameters for an electrostatic chuck that may be utilized in different chambers running the same recipe with minimal to no variation in product and/or wafer-to-wafer results. The ESC 140 as described herein reduces RF losses to ground, which enhances process results. Additionally, ESC's 140 produced according to the parameters described herein provide sufficient DC voltage to wafer capacitance while minimizing capacitance to ground, which enhances process results. Further, additional hardware and/or adjustment of power supplies that may be necessary to mitigate chamber-to-chamber mismatches are not needed, which lowers the cost of ownership and streamlines processing, which increases throughput.

While the foregoing is directed to embodiments of the present invention, other and further embodiments of the invention may be devised without departing from the basic scope thereof, and the scope thereof is determined by the claims that follow.

The invention claimed is:

1. A method for manufacturing an electrostatic chuck, comprising:

placing a ceramic powder in a mold;

sintering and/or pressing the ceramic powder to produce a ceramic body having a crystal structure with a dissipation factor of about 0.11 to about 0.16 determined by an electrical test; and adhering the ceramic body to a ceramic base.

2. The method of claim 1, further comprising:

forming an electrode in the ceramic powder; and forming one or more heating elements in the ceramic powder.

3. The method of claim 1, wherein the ceramic body is coupled to a conductive base.

4. The method of claim 1, wherein the dissipation factor is measured at temperatures of about room temperature to about 250° Celsius.

5. A method for manufacturing an electrostatic chuck, comprising:

placing a ceramic powder in a mold;

forming an electrode in the ceramic powder;

sintering and/or pressing the ceramic powder to produce a ceramic body having a crystal structure with a dissipation factor of about 0.11 to about 0.16 determined by an electrical test; and adhering the ceramic body to a ceramic base.

6. The method of claim 5, wherein the dissipation factor is measured at temperatures of about room temperature to about 250° Celsius.

7. The method of claim 5, further comprising:

forming one or more heating elements in the ceramic powder, wherein the ceramic body has a capacitance of about 750 picoFarads to about 950 picoFarads between the electrode and the heating elements.

8. The method of claim 7, wherein the capacitance is measured at temperatures of about room temperature to about 250° Celsius.

9. The method of claim 7, wherein the one or more heating elements comprise inner and outer heating elements.

10. The method of claim 5, wherein the ceramic body comprises a dielectric thickness of about 0.041 inches to about 0.044 inches disposed over the electrode.

11. A method for manufacturing an electrostatic chuck, comprising:

placing a ceramic powder in a mold;

forming an electrode and one or more heating elements in the ceramic powder;

sintering and/or pressing the ceramic powder to produce a ceramic body having a crystal structure with one or both of a dissipation factor of about 0.11 to about 0.16 and a capacitance of about 750 picoFarads to about 950 picoFarads between the electrode and the one or more heating elements;

adhering the ceramic body to a ceramic base; and coupling the ceramic body to a conductive plate.

12. The method of claim 11, wherein the one or more heating elements comprise inner and outer heating elements.

13. The method of claim 11, wherein the ceramic body comprises a dielectric thickness of about 0.041 inches to about 0.044 inches disposed over the electrode.

14. The method of claim 11, wherein the dissipation factor is measured at temperatures of about room temperature to about 250 ° Celsius.

15. The method of claim 11, wherein the capacitance is measured at temperatures of about room temperature to about 250° Celsius.

* * * * *